United States Patent [19]

Dean et al.

[11] Patent Number: 4,494,133

[45] Date of Patent: Jan. 15, 1985

[54] INFRARED SENSITIVE PHOTO DIODE

[75] Inventors: Anthony B. Dean; Robin F. C. Farrow, both of Malvern, England; Piero Migliorato, Rome, Italy; Anthony M. White; Gerald M. Williams, both of Malvern, England

[73] Assignee: The Secretary of State for Defence in Her Britannic Majesty's Government of the United Kingdom of Great Britain and Northern Ireland, London, England

[21] Appl. No.: 386,082

[22] Filed: Jun. 7, 1982

[30] Foreign Application Priority Data

Jun. 23, 1981 [GB] United Kingdom ............... 8119440

[51] Int. Cl.$^3$ ........................................... H01L 27/14
[52] U.S. Cl. ........................................... 357/30; 357/16; 357/32; 357/61
[58] Field of Search ............... 357/30, 30 E, 16, 61, 357/63, 52, 32, 30 A, 30 B, 30 D, 30 F, 30 G, 30 H, 30 I, 30 J, 30 K, 30 M, 30 P, 30 R

[56] References Cited

U.S. PATENT DOCUMENTS

| 4,132,999 | 1/1979 | Maillé et al. | 357/30 |
| 4,374,678 | 2/1983 | Castro | 357/16 X |
| 4,377,904 | 3/1983 | Chapman et al. | 357/61 X |

FOREIGN PATENT DOCUMENTS 2100927 1/1983 United Kingdom ............ 357/30 B

OTHER PUBLICATIONS

Igras et al., "Investigation of Ion Implanted Graded Gap (CdHgTe) Photodiodes", *Electron Technology*, 10, 4, pp. 63-70.

Chu et al., "High-Performance Backside-Illuminated Hg$_{78}$Cd$_{22}$Te/CdTe ($\lambda$Cd=10 $\mu$m) Planar Diodes", *Appl. Phys. Lett.*, 37, 5, Sep. 1, 1980, pp. 486-488.

Itoh et al., "HgCdTe Photoconductive Detector Arrays", *Fujitsu Sci. & Tech. J.*, vol. 16, No. 3, Sep. 1980, pp. 151-165.

Vérié et al., "Cd$_x$Hg$_{1-x}$Te Infrared Photovoltaic Detectors", *Applied Physics Letters*, vol. 10, No. 9, pp. 241-243, May 1, 1967.

*Primary Examiner*—Andrew J. James
*Assistant Examiner*—William A. Mintel
*Attorney, Agent, or Firm*—Cushman, Darby & Cushman

[57] ABSTRACT

A photo diode formed by a substrate of Cd$_x$Hg$_{1-x}$Te covered with a layer of CdTe forming a p-n junction. The substrate may be p-type in which case the layer is n-type or vice versa. An array of photo diodes may be formed by covering the substrate with semi-insulating CdTe and forming islets of In on the CdTe. Heating causes In to diffuse into the CdTe doping it n-type. This results in regions of n-type CdTe surrounded by semi-insulating CdTe each region forming, with the substrate, a photo diode. The heating also causes diffusion between the Cd$_x$Hg$_{1-x}$Te and CdTe to give a graded heterostructure. Electrical connections are made to the substrate, and each n-type region. The n-type CdTe region may alternatively be formed by molecular beam epitaxial growth techniques using a beam of In dopant.

12 Claims, 3 Drawing Figures

INFRARED SENSITIVE PHOTO DIODE

This invention relates to photo diodes.

A photo diode is a two terminal semiconductor device having one terminal attached to a piece of p-type material and the other terminal connected to a piece of n-type material with a p-n junction between the two types of materials. An electron flow occurs across the p-n junction when illuminated by electro magnetic radiation of a suitable wavelength.

One known photo diode comprises a substrate of p-type $Cd_xHg_{1-x}Te$ (C.M.T.) on which a layer of ZnS has been grown. This is described e.g. in App. Phy. Letts. 34(1) Jan. 1, 1979, pages 50–52, M Lanir et al. A p-n junction is formed in the bulk of the CdHgTe by ion implantation through the ZnS. Such a device is sensitive to infra red radiation and is therefore useful in thermal imaging systems where the thermal image of a scene is measured and used to form a visible display on a cathode ray tube.

According to this invention an infra red sensitive photo diode comprises a piece of $Cd_xHg_{1-x}Te$ and a piece of CdTe forming a p-n junction with terminals connected to the p and n type materials. The $Cd_xHg_{1-x}Te$ may be p-type in which case the CdTe is n-type or vice versa.

The n-type CdTe may be grown as a semi-insulating layer with a layer of a group IIIa or VII donor dopant deposited on top and diffused into the CdTe to form n-type CdTe. The dopant may be In. A p-type CdTe layer may be grown in a similar manner using as dopants P, As, Ag, or Au.

Alternatively the CdTe may be grown n-type by molecular beam epitaxial techniques with an In dopant.

When built as an array of photo diodes, areas of C.M.T. not forming diode junctions may be passivated by a layer of semi-insulating CdTe.

The CdTe layers may be grown by an suitable epitaxial growth technique, e.g. M.B.E., vapour growth, etc.

Growth of layers using M.B.E. techniques is described in Chapter 1.7 of Crystal Growth & Materials edited by E. Kaldis & H. J. Scheel published by North Holland Publishing Co., Amsterdam, 1977.

The invention will now be described, by way of example only, with reference to the accompanying drawings of which:

Figure 1:
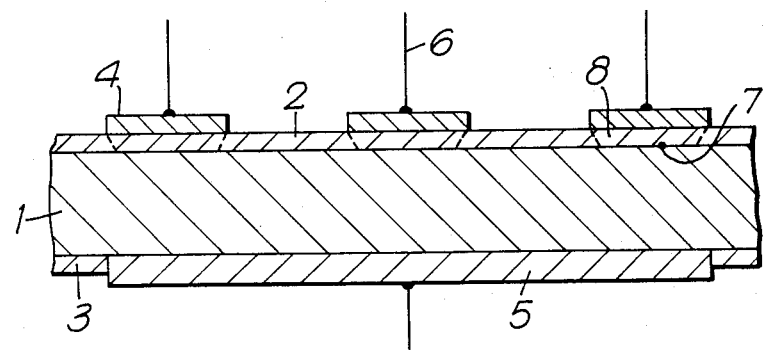
FIG. 1 is a cross section of a photo diode array formed on a C.M.T. substrate.

The photo diode of FIG. 1 comprises a p-type $Cd_xHg_{1-x}Te$ (C.M.T.) substrate 1 of thickness 10–30 $\mu$m. Typically x is 0.2 to 0.3 and acceptor concentration $N_A = 1$ to $5 \times 10^{16}$ cm$^{-3}$. The substrate 1 is cut, cleaned, and polished and placed in a molecular beam epitaxial (M.B.E.) growth chamber where a protective passivating layer 2, 3 of CdTe is grown on all surfaces. Typical layer 2 thickness on top of the substrate 1 is 0.5 $\mu$m in a range of about 0.2 to 1 $\mu$m. Islands 4 of In are deposited, e.g. by evaporation, on the top surface of CdTe$_x$2. The structure is then heated typically at 70°–120° C. for 4 to 40 hours to diffuse In into the CdTe 2 giving n-type heavily doped regions 8 (e.g. number of electrons, $n > 5 \times 10^{16}$ cm$^{-3}$) under the islands 4. Additionally this heating causes inter diffusion at the C.M.T. and CdTe interface (p-n junction 7) with Hg diffusing into the CdTe layer 2 and Cd diffusing into the C.M.T. This gives a gradual material composition change creating a graded heterostructure where the p-n junction is close to the heterojunction. A back electrode 5, e.g. of Au, is formed through apertures in the bottom CdTe layer direct onto the substrate. A top terminal connection 6 is made separately to each In island 4.

As an alternative, the C.M.T. substrate can be thick in which case no passivation of the bottom surface is necessary although it may be applied as above.

Infra red radiation on the p-n junction 7 causes a measurable voltage or current flow (dependent on the external circuitry) to be developed at the terminals 5, 6.

Figure 2:
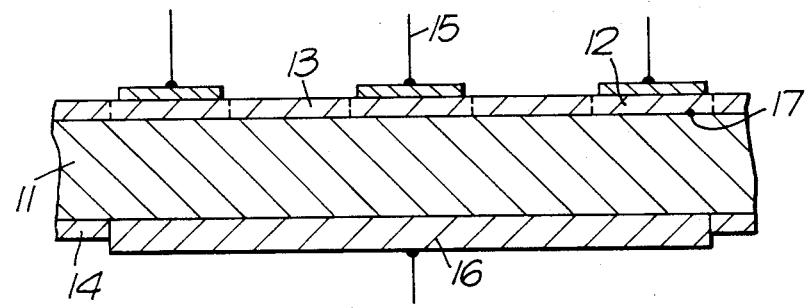
FIG. 2 is an alternative to FIG. 1.

FIG. 2 shows an alternative form of photo diode array comprising a p-type $Cd_xHg_{1-x}Te$ substrate 11 with islands 12 of n-type doped CdTe. Between the islands 12 is a layer 13 of semi-insulating CdTe. A passivating layer 14 of CdTe covers the remaining substrate surfaces. The n-type CdTe material 12 is grown in a molecular beam epitaxial chamber using an In dopant source in addition to the Cd, and Te sources. Alternatively the stoichiometry of the CdTe layer may be adjusted to give semi-insulating or semi-conducting layers. Photolithographic techniques are used to define the different parts of the top layer. For example islands of photo resist may be formed on the top surface of the substrate. A semi-insulating layer of CdTe is grown over the islands and top of the substrate. The resist is then lifted off leaving apertures through which n-type CdTe is grown.

Terminal connections 15, 16 are made to each island and the bottom of the substrate 11 as before.

The structure is heated e.g. at 70°–120° C. for 4–40 hours to allow diffusion at the p-n junction 17 as before.

Alternatively the composition of the n-type CdTe may be changed during molecular beam epitaxial growth. For example the alloy $Cd_xHg_{1-x}Te$ may be grown initially and the Hg source gradually reduced until only doped CdTe is being grown. Such a graded composition may also be used in the device of FIG. 1.

Figure 3:
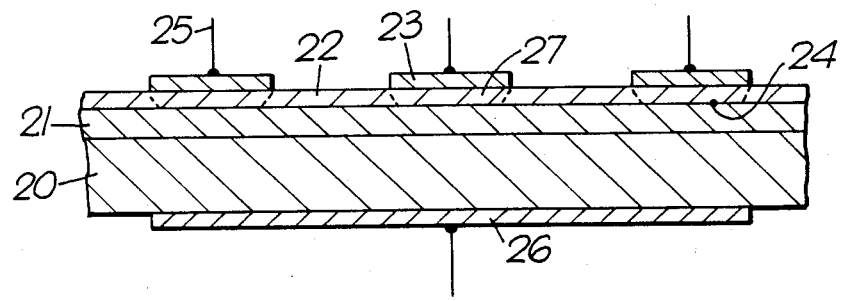
FIG. 3 is a photo diode grown on a CdTe substrate.

FIG. 3 shows another form of photo diode array. It comprises a p-type semi-conducting substrate 20 of CdTe on which a p-type layer 21 of $Cd_xHg_{1-x}Te$ is grown (or polished, lapped) to a typical thickness of 10 to 30 $\mu$m. A semi-insulating layer of CdTe 22 is grown on the layer and islands 23 of In deposited on the CdTe 22 as in FIG. 1. As before the device is heated to diffuse the In 23 into the CdTe layer 27, and also cause a diffusion at the p-n junction 24. Terminals 25, 26 are connected top and bottom as before.

Alternatively the CdTe 20 may be grown on a supporting base of other suitable material by M.B.E. As an alternative to an electrode 26 on the rear surface electrodes may be arranged on the top surface of the C.M.T. 21 to one side of the islands 23.

The C.M.T. 21 may be grown by liquid, vapour, or molecular beam epitaxial techniques or using alkyls of Cd and Te flowing over the CdTe substrate 20 in an atmosphere of Hg. Such a technique is described in U.K. patent application No. 2,078,695 A, U.S. patent application Ser. No. 266,046.

The n-type CdTe of FIG. 3 may alternatively be formed as in FIG. 2 using In doped and molecular beam epitaxial techniques. In another form of CdTe layer may be selectively n-type doped by implantation of In ions.

Also the CdTe layer may be formed with a graded composition i.e. starting by growing C.M.T. and gradually reducing the Hg source.

What I claim is:

1. An infra red sensitive photo diode comprising:
   a substrate of $Cd_xHg_{1-x}Te$ of a first conductivity type,
   a layer of CdTe of a second conductivity type on the substrate, the substrate and layer forming a p-n heterojunction, and
   a plurality of electrical terminals respectively connected to the substrate and to the layer.

2. The photo diode of claim 1 wherein regions of the substrate not covered by the CdTe layer are covered by a passivating layer of semi-insulating CdTe.

3. The photo diode of claim 2 formed into an array of photo diodes on the same $Cd_xHg_{1-x}Te$ substrate with regions of CdTe of said second conductivity type electrically isolated from one another by the semi-insulating CdTe.

4. The photo diode of claim 1 wherein there is a graded heterostructure between the two materials.

5. The photo diode of claim 1 wherein the $Cd_xHg_{1-x}Te$ is p-type and the CdTe is n-type.

6. The photo diode of claim 5 wherein the n-type CdTe is formed by diffusion of a group IIIa or VII donor dopant into a semi-insulating layer of CdTe.

7. The photo diode of claim 6 wherein the dopant is In.

8. The photo diode of claim 5 wherein x is in the range 0.2 to 0.3 inclusive and the acceptor concentration in the $Cd_xHg_{1-x}Te$ material is in the range 1 to $5 \times 10^{16} cm^{-}$.

9. The photo diode of claim 5 wherein n-type region of the CdTe are doped to give the number of electrons, $n > 5 \times 10^{16} cm^{-3}$.

10. The photo diode of claim 1 wherein the $Cd_xHg_{1-x}Te$ is n-type and the CdTe is p-type.

11. The photo diode of claim 2 wherein the CdTe is a layer having a thickness in the range 0.2 to 1 $\mu m$.

12. The photo diode of claim 1 formed into an array comprising a substrate of p-type $Cd_xHg_{1-x}Te$ having a surface passivated with a layer of semi-insulating CdTe, regions of n-type CdTe formed by In selectively deposited on the CdTe and diffused into the CdTe by heating in the range 70° to 120° C. each region of n-type CdTe providing a photo diode, and electrical contacts associated with each n-type region and with the substrate.

* * * * *